United States Patent
Hew

(10) Patent No.: US 8,862,798 B1
(45) Date of Patent: Oct. 14, 2014

(54) FAST PARALLEL-TO-SERIAL MEMORY DATA TRANSFER SYSTEM AND METHOD

(75) Inventor: Yin Chong Hew, Selama (MY)

(73) Assignee: Altera Corporation, San Jose, CA (US)

( * ) Notice: Subject to any disclaimer, the term of this patent is extended or adjusted under 35 U.S.C. 154(b) by 26 days.

(21) Appl. No.: 13/310,420

(22) Filed: Dec. 2, 2011

(51) Int. Cl.
*G06F 13/12* (2006.01)
*G06F 13/38* (2006.01)

(52) U.S. Cl.
USPC .............................................. 710/71; 710/65

(58) Field of Classification Search
None
See application file for complete search history.

(56) References Cited

U.S. PATENT DOCUMENTS

| | | | |
|---|---|---|---|
| 5,724,505 A | 3/1998 | Argade | |
| 6,028,445 A | 2/2000 | Lawman | |
| 6,049,222 A | 4/2000 | Lawman | |
| 6,421,812 B1 | 7/2002 | Wang et al. | |
| 6,493,862 B1 | 12/2002 | Young et al. | |
| 6,651,199 B1 | 11/2003 | Shokouhi | |
| 7,248,070 B1 | 7/2007 | Guilloteau et al. | |
| 7,265,578 B1 | 9/2007 | Tang et al. | |
| 7,343,470 B1 | 3/2008 | Joyce et al. | |
| 7,397,274 B1 | 7/2008 | Tang et al. | |
| 7,464,244 B2 * | 12/2008 | Sasaki ........................... | 711/170 |
| 7,689,726 B1 | 3/2010 | Sundararajan et al. | |
| 8,291,295 B2 * | 10/2012 | Harari et al. ................... | 714/763 |
| 8,321,597 B2 * | 11/2012 | Yu et al. ........................... | 710/5 |
| 2006/0149870 A1 * | 7/2006 | Sears et al. ....................... | 710/71 |
| 2008/0062788 A1 * | 3/2008 | Kang ............................. | 365/201 |
| 2009/0164674 A1 * | 6/2009 | Noda et al. ...................... | 710/30 |
| 2009/0193184 A1 * | 7/2009 | Yu et al. ......................... | 711/103 |
| 2011/0103164 A1 * | 5/2011 | Yun et al. ....................... | 365/201 |
| 2012/0265928 A1 * | 10/2012 | Mun et al. ..................... | 711/103 |
| 2012/0284587 A1 * | 11/2012 | Yu et al. ......................... | 714/773 |

* cited by examiner

*Primary Examiner* — Elias Mamo

(57) ABSTRACT

An integrated circuit (IC) that enables a fast parallel-to-serial memory data transfer is described. The IC includes a first input output (IO) interface operable to receive a plurality of data in parallel from a memory device, wherein the plurality of data is a binary sequence. The IC also includes a controller receiving the plurality of data from the first IO interface, wherein the controller is operable to generate a compressed data by compressing the plurality of data, wherein a portion of the compressed data provides information on a significant portion of the plurality of data. And the IC also includes a second IO interface receives the compressed data from the controller and serially shifts the compressed data out of the IC.

12 Claims, 5 Drawing Sheets

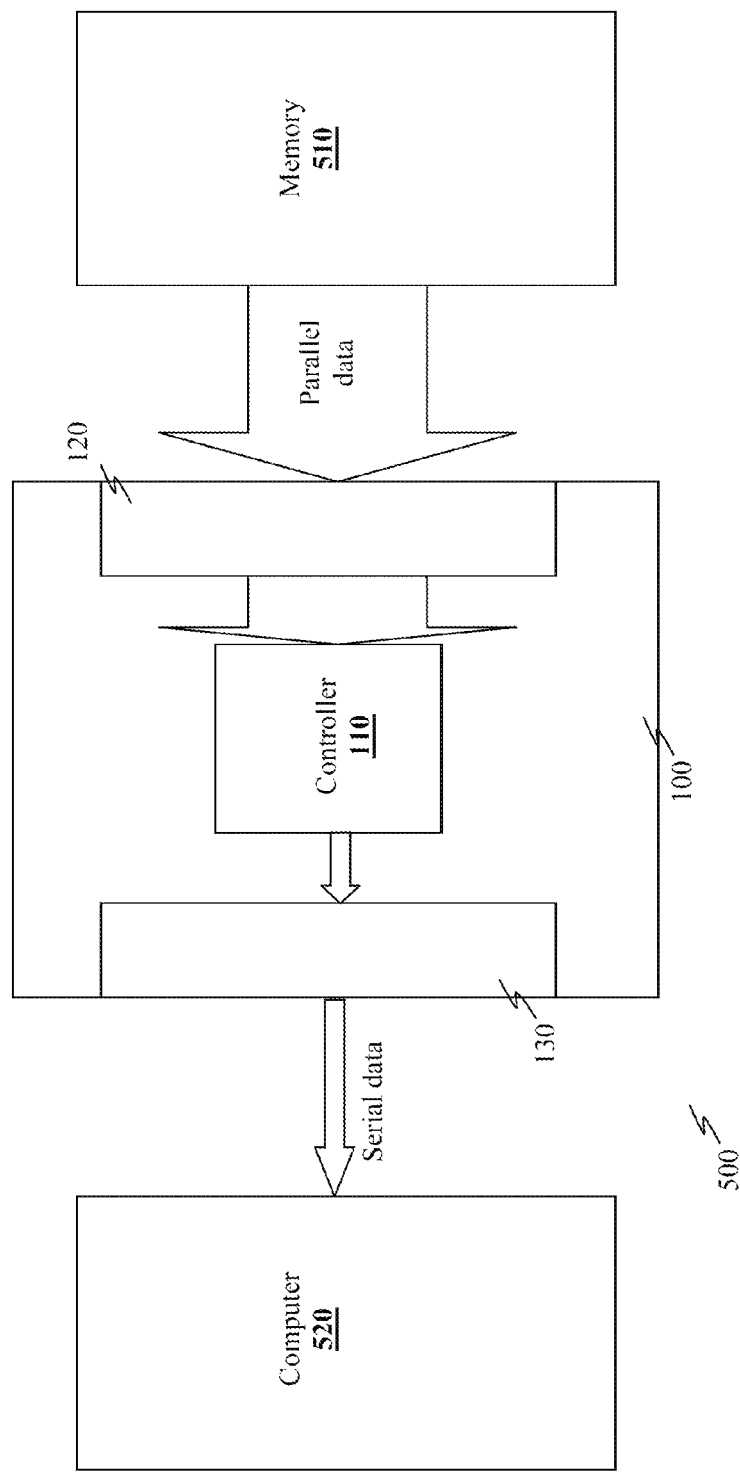

FAST PARALLEL-TO-SERIAL MEMORY DATA TRANSFER SYSTEM AND METHOD

BACKGROUND

Data transmission refers to the concept of transferring a digital bit stream from one point to another through transmission channels. Data transmission can be classified into two categories, serial data transmission and parallel data transmission. Parallel data transmission transfers multiple bits via multiple data channels at a particular time. In contrast, serial data transmission transfers one bit via a single data channel at a particular time.

Communication between a memory device and a microprocessor in a Personal Computer (PC) can be done using data transmission. However, PCs are mostly restricted to a specific Input Output (IO) standard interface, e.g., the Universal Serial Bus (USB) standard interface, which is a serial interface. This presents a major issue when a common memory interface is implemented in a parallel fashion.

Therefore, circuitry to convert parallel data to serial data is typically utilized. A limitation with such a solution is the bottleneck created by the limits on the data transmission clock speed due to the serial data transmission. For example, data having 32 bits may be transmitted in a single clock cycle via a 32-bit parallel data channel, but require 32 clock cycles when transmitted in a serial manner.

It is within this context that the embodiments described herein arise.

SUMMARY

Embodiments described herein include a fast parallel-to-serial memory data transfer system and related methods. It should be appreciated that the embodiments can be implemented in numerous ways, such as a process, an apparatus, a system, a device, or a method. Several embodiments are described below.

In one embodiment, an integrated circuit (IC) that enables a fast parallel-to-serial memory data transfer is described. The IC includes a first input output (IO) interface operable to receive a plurality of data in parallel from a memory device, wherein the plurality of data is a digital sequence. The IC also includes a controller capable of receiving the plurality of data from the first IO interface, wherein the controller is operable to generate compressed data, wherein a header within the compressed data provides information on the plurality of data. The IC also includes a second IO interface that receives the compressed data from the controller and serially shifts the compressed data out of the IC.

In another embodiment, the IC system that enables a fast parallel-to-serial memory data transfer is described. The IC system includes a memory that stores data, where the data is in binary format. The IC system also has an intermediate IC that is coupled to the memory. The intermediate IC is operable to receive the data from memory in parallel and output compressed data in serial, wherein the header within the compressed data provides information about the data. The IC system also has a computer coupled to the intermediate IC, and the computer may receive the compressed serial data and uncompressed may uncompress the compressed data.

In another embodiment, a method of operating an integrated circuit (IC) is described. The method includes receiving a plurality of data in parallel, wherein the plurality of data is a binary sequence. Next, a header is generated based on the plurality of data, wherein a single bit of the header defines a continuous predefined number of bits, e.g. a byte, in the plurality of data respectively. Finally, the header from the IC is serially outputted.

Other aspects of the embodiments will become apparent from the following detailed description, taken in conjunction with the accompanying drawings, illustrated by way of example.

BRIEF DESCRIPTION OF THE DRAWINGS

The embodiment may be understood by reference to the following description taken in conjunction with the accompanying drawings.

FIG. 5, meant to be illustrative and not limiting, illustrates an IC system in accordance with an embodiment of the present invention.

DETAILED DESCRIPTION

The following embodiments describe a fast parallel-to-serial memory data transfer system and a method to operate the system. It will be obvious, however, to one skilled in the art, that the present embodiment may be practiced without some or all of these specific details. In other instances, well-known operations have not been described in detail in order not to unnecessarily obscure the present embodiment.

In one embodiment, a fast parallel-to-serial memory data transfer capability may be implemented on an Integrated Circuit (IC). The fast parallel-to-serial memory data transfer capability may be achieved by a real time data compression that increases the transfer speed of serial data that was initially received in parallel. The fast parallel-to-serial memory data transfer capability achieves this by reducing the number of bits to be serially transferred via data compression. The compressed data has a header and a body that carries information regarding the compressed data. The implementation of the invention improves, for example, reading information back from a FLASH memory.

Figure 1:
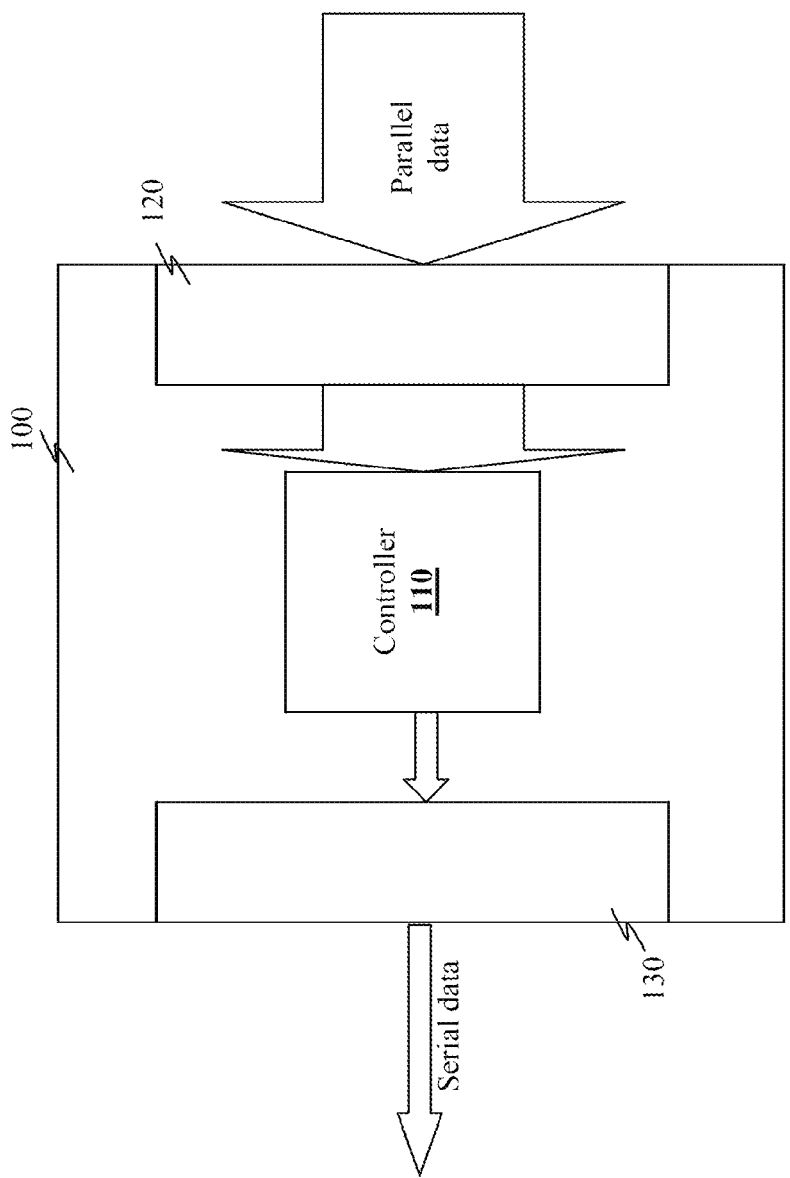
FIG. 1, meant to be illustrative and not limiting, illustrates an Integrated Circuit (IC) in accordance with an embodiment of the present invention.

FIG. 1, meant to be illustrative and not limiting, illustrates an Integrated Circuit (IC) in accordance with one embodiment. The IC 100 includes a parallel Input Output (IO) interface 120, a serial IO interface 130 and a controller 110. In one embodiment, IC 100 may be a Complex Programmable Logic Device (CPLD) or a Field Programmable Gate Array (FPGA). Controller 110 can be implemented through programmable logic elements (LEs) in a CPLD/FPGA architecture.

In another embodiment, IC 100 may be an Application Specific Integrated Circuit (ASIC) or Application Specific Standard Product (ASSP). Controller 110 is implemented as a hard circuit block in the ASIC/ASSP. It is to be appreciated that the functionality of controller 110 remains the same in both embodiments.

IO interface 120 receives or transfers information in parallel. In one embodiment, IO interface 120 receives at least one byte (8 bits) of information in parallel. It is appreciated that IC 100 may also able to receive two bytes (16 bits), four bytes (32 bits), or larger numbers of bits of information in parallel. The information is transferred to or received from hardware external to IC 100. The hardware external to IC 100 is a memory device, in one embodiment.

IO interface 120 is adapted to support an IO standard. The IO interface 120 for the FGPA or CPLD can be configured to support various types of IO standards. It is appreciated that the IO standard is configurable according to the supported external hardware coupled to IC 100. In one embodiment, the Common Flash Interface (CFI) standard is utilized when IC 100 is coupled to a NOR FLASH memory. In another embodiment, the Open NAND Flash Interface (ONFI) standard is utilized when IC 100 is coupled to a NAND FLASH memory. Both standards enable receiving data in parallel.

IO interface 130 receives or transfers information serially. IO interface 130 transfers a single bit, as part of a longer sequence, on a particular clock edge (typically on the rising edge). Therefore, transferring bits of information serially at IO interface 130 may require at least 8 consecutive rising clock edges. IO interface 130 is also adapted to support an IO standard. In one embodiment, IO interface 130 is adapted to support the Joint Test Action Group (JTAG) standard, Universal Serial Bus (USB) standard or Ethernet standard. For a FPGA or CPLD, IO interface 130 may be configured to support the JTAG standard, which can be utilized to receive or transfer serial stream information.

The information received from IO interface 120 will eventually be transferred out through IO interface 130. It is appreciated that the parallel stream information received at IO interface 120, e.g. the information having at least 8 bits, will be transferred out from IO interface 130 after at least 8 clock cycles.

Controller 110 receives the parallel information from IO interface 120 and transfers the information serially to IO interface 130. Controller 110 compresses the parallel information according to a real-time compression scheme. The compression scheme is designed with the objective of achieving (i) a very low data compression time and (ii) a very small compressed data size. In one embodiment, the compressed data from controller 110 has a header and a body, both derived from the parallel information. It is appreciated that for an FPGA/CPLD, the compression scheme can be altered depending on the type of incoming information and the desired objective.

Figure 2:
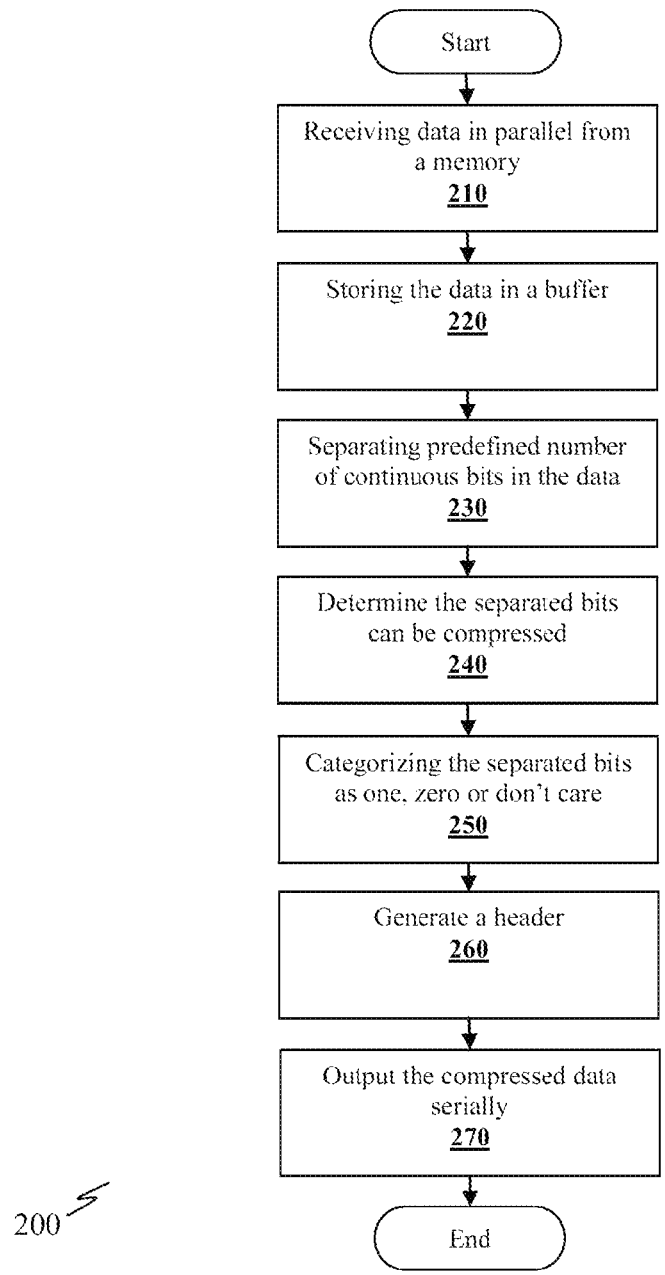
FIG. 2, meant to be illustrative and not limiting, illustrates a method of compressing the data in accordance with an embodiment of the present invention.
Figure 4:
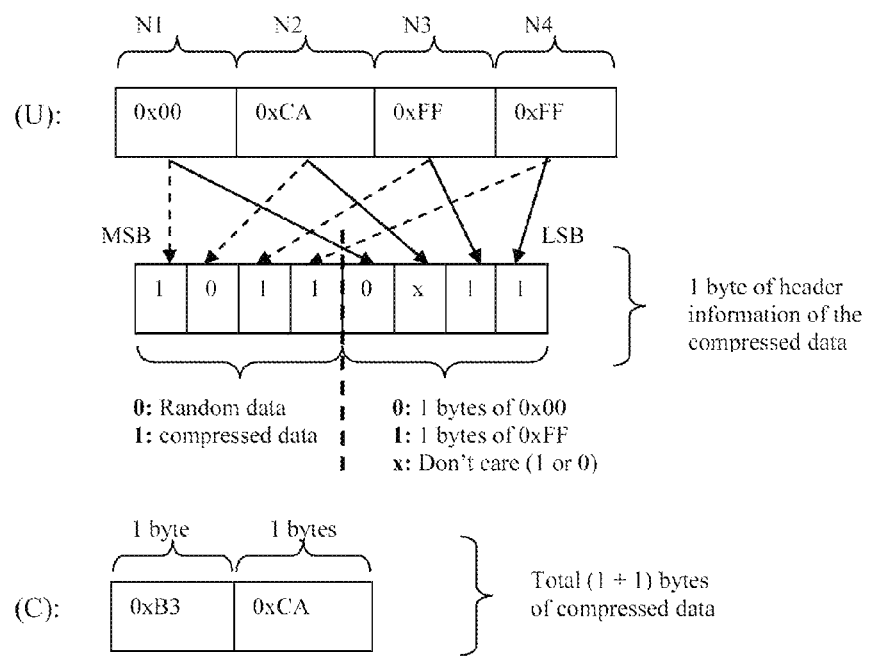
FIG. 4, meant to be illustrative and not limiting, illustrates an example of uncompressed data and compressed data in accordance with an embodiment of the present invention.

FIG. 2, meant to be illustrative and not limiting, illustrates a method of compressing the data in accordance with one embodiment. The method 200 can be utilized to read back data from a FLASH memory device. The method 200 can be implemented on IC 100 of FIG. 1. The method 200 will be discussed with reference to an example of uncompressed data as illustrated in FIG. 4.

The IC receives data in parallel from a memory as in operation 210. The parallel data is received via a parallel IO interface, e.g. IO interface 120 of IC 100 in FIG. 1. The memory can be either a NOR or NAND FLASH memory device. The parallel data can be of size 8 (1 byte), (2 bytes) or 32 (4 bytes) bits. The data is stored in a storage buffer as in operation 220. The buffer can be either a memory array or a string of registers in the IC. The data is stored to form a string of consecutive bits. In one embodiment the string of continuous bits is 32 bits (4 bytes). The string of consecutive bits may also be referred to as uncompressed data. An example of the string of 32 consecutive bits is illustrated as uncompressed data (U) in FIG. 4. The string of 32 consecutive bits is represented as 0x00CAFFFF in hexadecimal form.

Each consecutive predefined number of bits, i.e., N bits, is identified from the continuous number of bits stored in the buffer. In one embodiment, the N bits are equivalent to sets of 8 bits. Hence, for the continuous 32 bits (reflecting 4 bytes of information), there are four consecutive 8 bits. In one embodiment, the first consecutive 8 bit sequence is represented by N1, the second consecutive 8 bit sequence is represented by N2, the third consecutive sequence of 8 bits is represented by N3 and the fourth consecutive 8 bit sequence is represented by N4. Based on the uncompressed data of FIG. 4, N1 is 0x00, N2 is 0xCA, N3 is 0xFF and N4 is 0xFF. Each of the N bits of data that are identified is separated from the continuous bits as in operation 230.

Next, for each of the separated N bits it is determined whether they can be compressed as in operation 240. In one embodiment, if one of the separated N bits (N1, N2, N3 or N4) is either a string of zeros or ones, the separated N bits can be compressed. However, if the separated N bits are neither a string of zeros or ones, then the separated N bits are not to be compressed. Based on the example of FIG. 4, the separated bits represented by N1, N3 and N4 can be compressed because N1 is a string of zeros (0x00), N3 is a string of ones (0xFF) and N4 is also a string of ones (0xFF). Sequence N2 cannot be compressed because it comprises a string of mixed ones and zeros bits (0xCA).

Next, the separated N bits are categorized as either a string of ones, zeros or "don't care" values as in operation 250. The "don't care" here indicates that the separated N bits will not be compressed. If the separated N bits is a string of ones, the separated N bits will be identified as '1,' if the separated N bits is a string of zeros, the separated N bits will be identified as '0' and if the separated N bits is a string of mixed zero and one bits, the separated N bits is identified as don't care 'x.'

Referring to the example of the uncompressed data of FIG. 4, N1 will be categorized as '0,' N2 will be categorized as 'x,' N3 will be categorized as '1' and N4 will be categorized as '1.' Then, the information of whether the separated N bits can be compressed and the information regarding the category of the separated N bits will be consolidated to generate a header of compressed data (C) as in operation 260. The generated header for compressed data in FIG. 4 is '0xB3.' It is appreciated that the position of the bits within the header is critical because the positions establish what the sequence of the data may look like.

Finally, the compressed data are outputted serially from the IC as in operation 270. The compressed data can be outputted through IO interface 130 of FIG. 1. The compressed data includes the header and the random data (which could not be compressed). As shown in FIG. 4, the compressed data include a header of 0xB3 and a body of 0xCA. It is appreciated that by compressing the 32 bits into 16 bits of information, the IC may output this information in 16 clock cycles.

Figure 3:
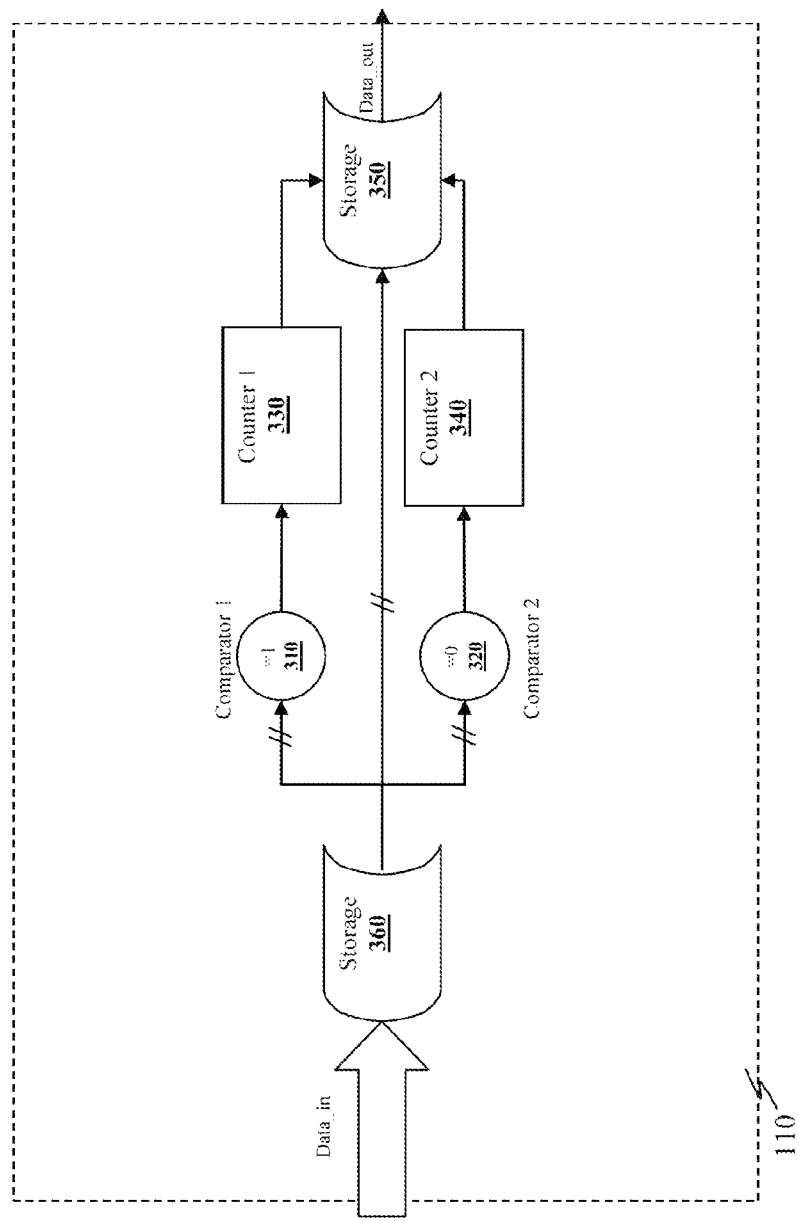
FIG. 3, meant to be illustrative and not limiting, illustrates a detailed implementation of a controller in accordance with an embodiment of the present invention.

FIG. 3, meant to be illustrative and not limiting, illustrates a detailed implementation of a controller in accordance with one embodiment. Controller 110 can be utilized to implement method 200 of FIG. 2. The controller 110 includes comparators 310 and 320, counters 330 and 340 and storage buffers 350 and 360.

Controller 110 receives input data, data_in. Data_in is parallel data received at IO interface 120 of FIG. 1. Data in is stored in storage 360. Data_in may also be referred as uncompressed data, in one embodiment. Storage buffer 360 can be either a memory array or a plurality of registers. Data_in is stored in sequential consecutive bits within storage buffer 360. The memory array or the plurality of registers is formed in a chain to store data in bits sequentially.

Storage buffer 360 is coupled to comparators 310 and 320 and storage buffer 350 via parallel interconnections. Comparator 310 identifies if the separated consecutive bits are identical to a string of ones. Comparator 320, on the other hand, identifies whether the separated consecutive bits are identical to a string of zeros. In one embodiment, the consecutive bits are separated into 8 bits and the parallel interconnections are wide enough to transfer 8 bits of data in a single clock cycle. It is appreciated that the separated consecutive bits from storage 360 are transferred simultaneously to comparators 310 and 320. Comparators 310 and 320 provide a means to execute operations 240 and 250 of FIG. 2.

Comparator 310 is coupled with counter 330 and comparator 320 is coupled to counter 340. Counter 330 increases its count when comparator 310 identifies that the separated string of consecutive bits is a string of ones. Counter 340 increments when comparator 320 identifies that the separated string of consecutive bits is a string of zeros. It is appreciated that the coupling that forms between comparators 310 and 320 and counters 330 and 340, respectively, are serial couplings. Upon identification within comparators 310 and 320, a flag signal reflecting the information of the comparator is sent.

Once the separated string of consecutive bits is determined to be either a string of ones, zeros or mixed bits, the information from counters 330 and 340 and storage buffer 360 are transferred to storage buffer 350. In one embodiment, the information is utilized to generate the header bit for separated consecutive bits. By transferring each of the separated consecutive bits through storage buffer 360 to storage buffer 350, the header for the compressed data can be generated. An example of a header is illustrated in FIG. 4. Data out is transferred out serially from storage 350. Data out is transferred serially from controller 110.

FIG. 5, meant to be illustrative and not limiting, illustrates an IC system in accordance with one embodiment. IC system 500 includes IC 100, memory 510 and computer 520. IC system 500 may be utilized with reference to method 200 of FIG. 2.

Memory 510 is coupled to IC 100 through a parallel coupling. Memory 510 is a FLASH memory in one embodiment. It is appreciated that the flash memory could include, for example a NAND flash memory or NOR flash memory. The data from memory 510 is transferred in parallel to IC 100. The data can be retrieved in sequence of 8 parallel bits, 16 parallel bits or 32 parallel bits of information in one embodiment.

Computer 520 receives serial data from IC 100. It is appreciated that serial data is generated by compressing the parallel data. The serial data includes the header bits that can be generated by method 200 of FIG. 2. Computer 520 decompresses the serial compressed data back into an uncompressed form. The header bit contains information on the type and positions of the compressed data, which will be used to reconstruct the uncompressed data. In one embodiment, a JTAG interface is utilized to transfer serial data from IC 100 to the computer 520. In another embodiment, a USB interface or an Ethernet interface is utilized to transfer serial data to the computer 520.

The embodiments thus far have been described with respect to integrated circuits. The method and apparatus described herein may be incorporated into any suitable circuit. For example, the method and apparatus may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just name a few.

The programmable logic device described herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An Integrated Circuit (IC) comprising:
    a first input output (IO) interface that receives a plurality of data in parallel from a memory device, wherein the plurality of data is a binary sequence;
    a controller that receives the plurality of data from the first IO interface, wherein the controller generates compressed data by compressing the plurality of data, and wherein a portion of the compressed data comprises information associated with a larger part of the plurality of data; and
    a second IO interface that receives the compressed data from the controller and serially shifts the compressed data out of the IC, wherein the controller comprises:
        a data buffer that stores the plurality of data;
        a first counter that counts a continuous predefined number of bits in the plurality of data that have a one value; and
        a second counter that counts a continuous predefined number of bits in the plurality of data that have a zero value.

2. The IC in claim 1, wherein the first IO interface is one of a Common Flash Interface (CFI) or an Open NAND Flash Interface (ONFI).

3. The IC in claim 1, wherein the first IO interface receives the plurality of data in one of eight, sixteen or thirty-two parallel bits.

4. The IC in claim 1, wherein the controller further comprises:
   a first comparator that counts bits within the plurality of data that have a logical one value; and
   a second comparator that counts bits within the plurality of data that have a logical zero value.

5. The IC in claim 4, wherein the controller further generates a header based on a first count from the first counter and a second count from the second counter, wherein the header is the portion of the compressed data that comprises information associated with a larger part of the plurality of data, wherein said controller further generates a first comparison result from the first comparator, and generates a second comparison result from the second comparator, and wherein the controller attaches the header to a continuous predefined number of random bits within the plurality of data.

6. The IC in claim 1, wherein the second IO interface conforms to one of a Joint Test Action Group (JTAG) standard, a Universal Serial Bus (USB) standard or an Ethernet standard.

7. An integrated circuit (IC) system, comprising:
   a memory that stores data in binary format;
   an intermediate IC that is coupled to the memory, wherein the intermediate IC receives the data from the memory in parallel and outputs a compressed data in serial, wherein a portion of the compressed data comprises information associated with a portion of the data and wherein the portion of the compressed data is smaller than the portion of the data; and
   a computer coupled to the intermediate IC, wherein the computer receives the compressed data in serial and uncompresses the compressed data, wherein the intermediate IC further comprises:
   a data buffer that stores the data;
   a first comparator that counts bits in the data that are bit one value;
   a second comparator that counts bits in the data that are bit zero value;
   a first counter that counts a continuous predefined number of bit ones in the data; and
   a second counter that counts a continuous predefined number of bit zeros in the data.

8. The IC system in claim 7, wherein the memory is one of NOR or NAND flash.

9. The IC system in claim 7, wherein the intermediate IC is coupled to memory based on one of a Common Flash Interface (CFI) standard or an Open NAND Flash Interface (ONFI) standard.

10. The IC system in claim 7, wherein the computer is coupled to the intermediate IC based on one of a Joint Test Action Group (JTAG) standard, a Universal Serial Bus (USB) standard or an Ethernet standard.

11. The IC system in claim 7, wherein the intermediate IC is one of a Field Programmable Gate Array (FPGA) or Complex Programmable Logic Device (CPLD).

12. The IC system in claim 7, wherein the intermediate IC is further that generates a header comprising counts from the first counter and the second counter, and attaches the header to a continuous predefined number of random bits in the data, wherein the header is the portion of the compressed data.

* * * * *